(12) United States Patent
Tokuno et al.

(10) Patent No.: US 7,341,956 B1
(45) Date of Patent: Mar. 11, 2008

(54) DISPOSABLE HARD MASK FOR FORMING BIT LINES

(75) Inventors: Hirokazu Tokuno, Cupertino, CA (US); Minh-Van Ngo, Fremont, CA (US); Angela T. Hui, Fremont, CA (US); Cinti Xiaohua Chen, Fremont, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 371 days.

(21) Appl. No.: 11/100,563

(22) Filed: Apr. 7, 2005

(51) Int. Cl.
*H01L 21/302* (2006.01)
*H01L 21/461* (2006.01)

(52) U.S. Cl. .................. 438/717; 438/585; 438/706

(58) Field of Classification Search .............. 438/585, 438/706–712, 717–725
See application file for complete search history.

(56) References Cited

U.S. PATENT DOCUMENTS

| | | | | |
|---|---|---|---|---|
| 5,753,557 A * | 5/1998 | Tseng | ............ | 438/303 |
| 6,171,940 B1 * | 1/2001 | Huang | ............ | 438/585 |
| 6,576,562 B2 * | 6/2003 | Ohuchi et al. | ............ | 438/725 |
| 6,605,541 B1 * | 8/2003 | Yu | ............ | 438/700 |
| 6,607,955 B2 * | 8/2003 | Lee | ............ | 438/256 |
| 6,620,741 B1 | 9/2003 | Gracias et al. | | |
| 6,764,903 B1 * | 7/2004 | Chan et al. | ............ | 438/257 |
| 6,797,565 B1 | 9/2004 | Yang et al. | | |
| 6,864,556 B1 * | 3/2005 | You et al. | ............ | 257/437 |
| 6,927,145 B1 | 8/2005 | Yang et al. | | |
| 7,037,850 B2 * | 5/2006 | Lee et al. | ............ | 438/725 |
| 2002/0086547 A1 * | 7/2002 | Mui et al. | ............ | 438/710 |
| 2003/0096503 A1 * | 5/2003 | Cho et al. | ............ | 438/694 |
| 2004/0005778 A1 * | 1/2004 | Kronke et al. | ............ | 438/689 |
| 2004/0058518 A1 | 3/2004 | Fang et al. | | |
| 2005/0136630 A1 | 6/2005 | Kim | | |
| 2005/0212035 A1 | 9/2005 | Utsuno et al. | | |
| 2006/0030151 A1 | 2/2006 | Ding et al. | | |
| 2006/0154477 A1 * | 7/2006 | Geng et al. | ............ | 438/637 |
| 2006/0264002 A1 * | 11/2006 | Tran et al. | ............ | 438/401 |

FOREIGN PATENT DOCUMENTS

DE  101 10 150 A1  9/2002
EP  1 170 800 A2  1/2002

OTHER PUBLICATIONS

2002 IEEE International Solid-State Circuits Conference, Session 6, "SRAM and Non-Volatile Memories," Feb. 4, 2004, 6 pages.
2002 IEEE International Solid-State Circuits Conference, 29 pages.

* cited by examiner

*Primary Examiner*—George R. Fourson
*Assistant Examiner*—John M. Parker
(74) *Attorney, Agent, or Firm*—Harrity Snyder LLP (57) ABSTRACT

A method includes forming a group of disposable hard mask structures on a semiconductor device that includes a group of memory cells. The method further includes using the disposable hard mask structures to precisely control a junction profile of the memory cells.

19 Claims, 10 Drawing Sheets

DISPOSABLE HARD MASK FOR FORMING BIT LINES

FIELD OF THE INVENTION

Implementations consistent with the principles of the invention relate generally to semiconductor manufacturing and, more particularly, to forming bit lines in semiconductor devices.

BACKGROUND OF THE INVENTION

The escalating demands for high density and performance associated with non-volatile memory devices require small design features, high reliability and increased manufacturing throughput. The reduction of design features, however, challenges the limitations of conventional methodology.

For example, when fabricating memory devices with small design features, it is difficult to maintain a relatively thick or vertically tall photoresist with smaller and smaller pitches. The top of the photoresist starts to round. This may result in a poor junction profile associated with subsequent ion implantation.

SUMMARY OF THE INVENTION

In an implementation consistent with the principles of the invention, a method includes forming a hard mask layer on a semiconductor device, forming a photoresist layer, patterning the photoresist layer, etching the hard mask layer using the patterned photoresist layer to form a group of hard mask structures, and performing an ion implantation to form source or drain junctions between successive hard mask structures.

In another implementation consistent with the principles of the invention, a method includes forming a group of disposable hard mask structures on a semiconductor device that includes a group of memory cells. The method further includes using the disposable hard mask structures to precisely control a junction profile of the memory cells.

In yet another implementation consistent with the principles of the invention, a method for forming a bit line is disclosed. The method includes forming a group of hard mask structures using a photoresist. Each hard mask structure is formed to a width ranging from 450 Å to about 1,200 Å and a height ranging from about 500 Å to about 5,000 Å. The method further includes performing a first implant process to form the bit line and removing the hard mask structures.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Exemplary Processing

Figure 1:
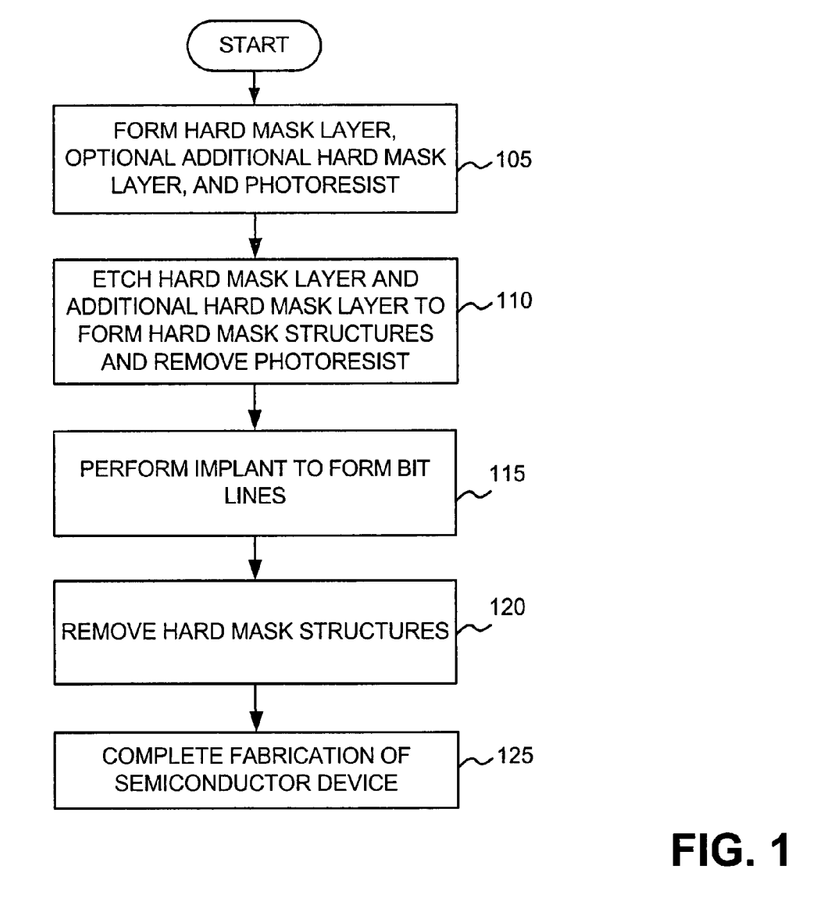
FIG. 1 illustrates an exemplary process for forming a semiconductor memory device in an implementation consistent with the principles of the invention.

FIG. 1 illustrates an exemplary process for forming a semiconductor memory device in an implementation consistent with the principles of the invention. In one implementation, the semiconductor memory device includes a core memory array of a flash memory device. FIGS. 2-10 illustrate exemplary views of a semiconductor memory device fabricated according to the processing described in FIG. 1.

Figure 2:
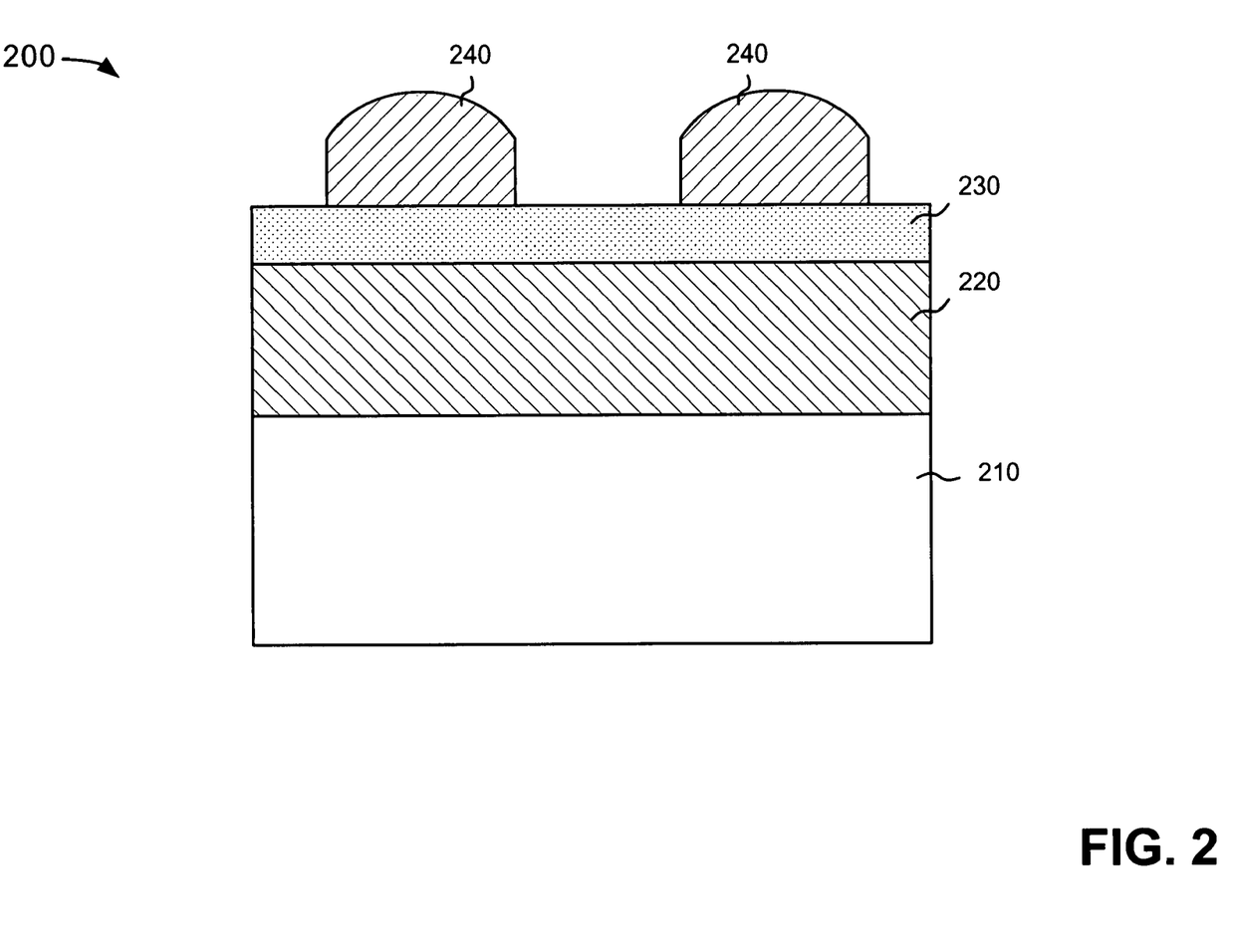
FIGS. 2-10 illustrate exemplary views of a semiconductor memory device fabricated according to the processing described in FIG. 1.

With reference to FIGS. 1 and 2, processing may begin with a semiconductor device 200 that includes a layer 210 (or an area 210). In one implementation, layer 210 may be any appropriately selected semiconductor substrate known in the art. For example, layer 210 may comprise silicon or other semiconducting materials, such as germanium, or combinations of semiconducting materials, such as silicon-germanium. Alternatively, layer 210 may include a layer of material formed one or more layers above the semiconductor substrate. In other implementations, area 210 may represent a group of memory cells formed in a core area of a memory array. In this implementation, the subsequent processing described below may be performed to facilitate forming source/drain junctions for each memory cell.

A hard mask layer 220 may be formed on layer 210 in a well-known manner (act 105). In one implementation consistent with the principles of the invention, hard mask layer 220 may be formed on layer 210 to a thickness ranging from about 500 Å to about 5000 Å. Hard mask layer 220 may comprise, for example, amorphous carbon, SiLK, other materials that comprise carbon or a polymer, etc.

An optional additional hard mask layer 230 may be formed on hard mask layer 220 (act 105). In one implementation, additional hard mask layer 230 may be formed on hard mask layer 220 to a thickness ranging from about 100 Å to about 3,000 Å. Additional hard mask layer 230 may comprise an anti-reflective coating (ARC) or other types of materials, such as SiON, SiOC, an oxide, or a silicon nitride.

A photoresist material may be patterned and etched to form masks 240 on the top surface of additional hard mask layer 230 (act 105). Masks 240 may be used to facilitate formation of one or hard mask structures on semiconductor device 200, as described in more detail below. The width of each mask 240 may range from about 450 Å to about 1,200 Å. In addition, the pitch (i.e., the center-to-center distance between masks 240 may range from about 900 Å to about 2,400 Å).

Figure 3:
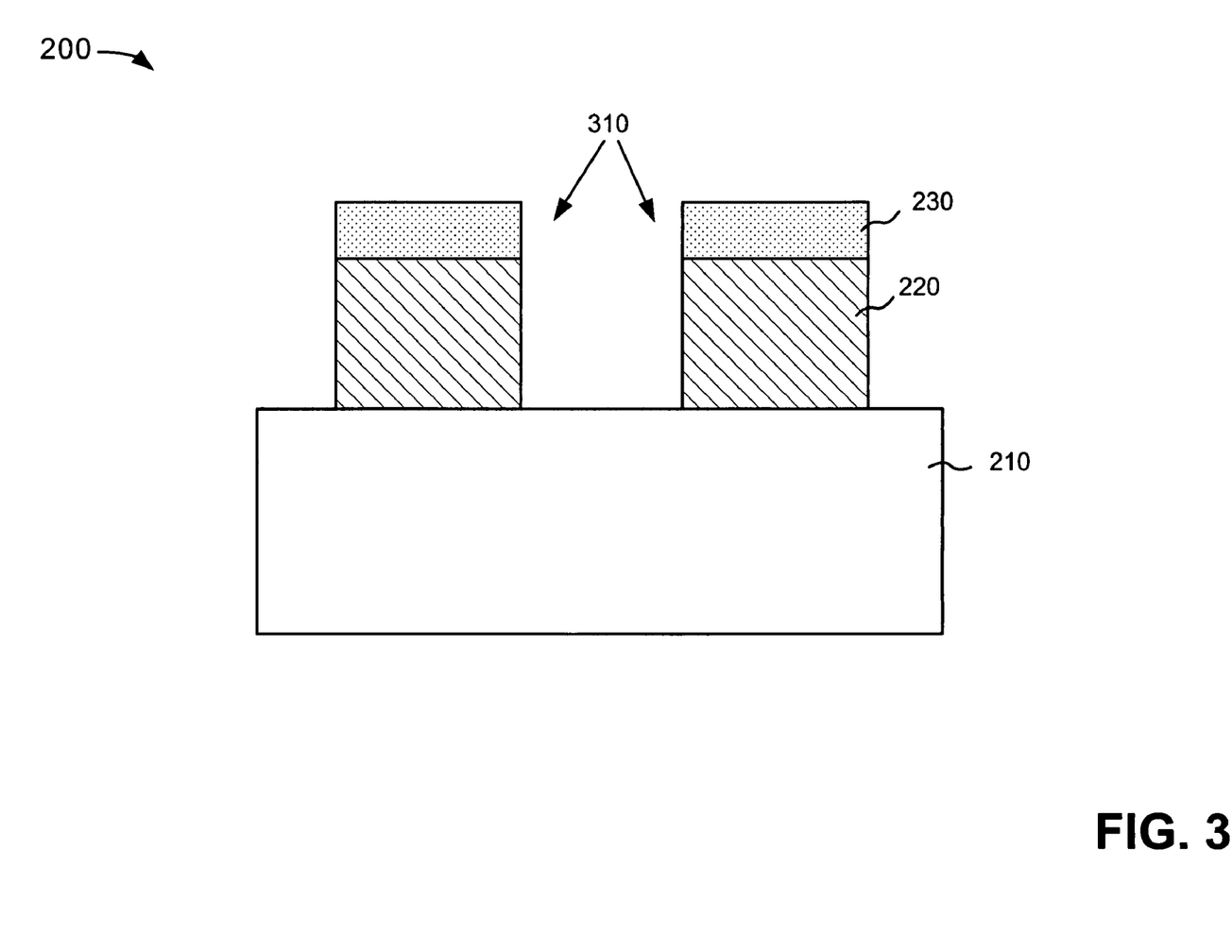

Semiconductor device 200 may then be etched, as illustrated in FIG. 3 (act 110). Referring to FIG. 3, layers 220 and 230 may be etched in a conventional manner with the etching terminating at layer 210, thereby forming hard mask structures 310. Photoresist mask 240 may be removed during the etching of layers 220 and 230 (act 110). The width of hard mask structures 310 may be substantially similar to the width of masks 240 (i.e., the width of each hard mask structure 310 may range from about 450 Å to about 1,200 Å). The pitch of mask structures 310 may also be substantially similar to the pitch of masks 240 (e.g., about 900 Å to about 2,400 Å). As will be described below, the dimensions of hard mask structures 310 and their substantially rectangular cross-sectional shape allow the junction profile of the semiconductor device to be precisely controlled. As illustrated in FIG. 3, hard mask structures 310 have a substantially rectangular cross-sectional shape, as opposed to masks 240 which exhibit rounding at the top portions. Having this uniform rectangular shape enables structures 310 to facilitate more precisely formed source/drain junction profiles for semiconductor device 200.

Figure 4:
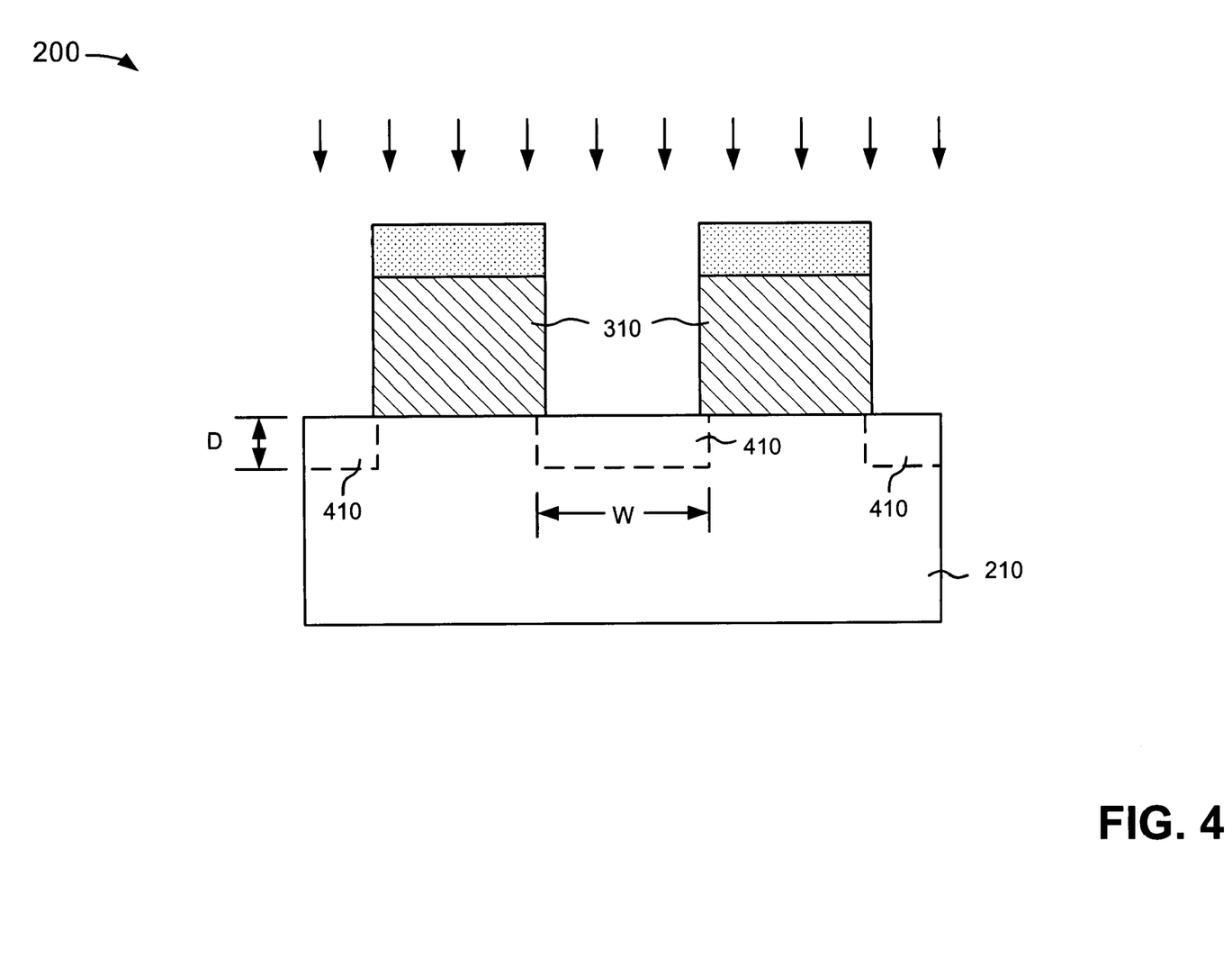

Source/drain junctions or bit lines 410 for a subsequently (or previously) formed memory array may be formed, as illustrated in FIG. 4, in the areas between hard mask structures 310 (act 115). In one implementation, bit lines 410 may be formed by a main perpendicular implant process. The main perpendicular implant may be a relatively high concentration implant that is capable of producing bit lines 410. In one implementation, a p-type dopant, such as boron, may be used as the dopant. The p-type dopant atoms may be implanted at a dosage of about $1 \times 10^{13}$ atoms/cm$^2$ to about $1 \times 10^{15}$ atoms/cm$^2$ and an implantation energy of about 4 KeV to about 40 KeV, which may depend on the desired junction depth for bit lines 410. Alternatively, an n-type dopant, such as arsenic or phosphorous, may be used as the dopant. The n-type dopant atoms may be implanted at a dosage of about $1 \times 10^{13}$ atoms/cm$^2$ to about $1 \times 10^{15}$ atoms/cm$^2$ and an implantation energy of about 4 KeV to about 40 KeV, which may depend on the desired junction depth for bit lines 410.

Due to the dimensions of hard mask structures 310 and their substantially rectangular profile, the junction profile of bit lines 410 may be precisely controlled. In one implementation consistent with the principles of the invention, the junction profile of bit lines 410 may be substantially aligned with the side surfaces of hard mask structures 310 and may have a substantially rectangular shape. That is, the ions are substantially blocked from penetrating beneath structures hard mask structures 310, resulting in a desired junction profile between hard mask structures 310. Bit lines 410 may, for example, be formed to a width (W) ranging from about 200 Å to about 600 Å and a depth (D) ranging from about 200 Å to about 3,000 Å.

Figure 5:
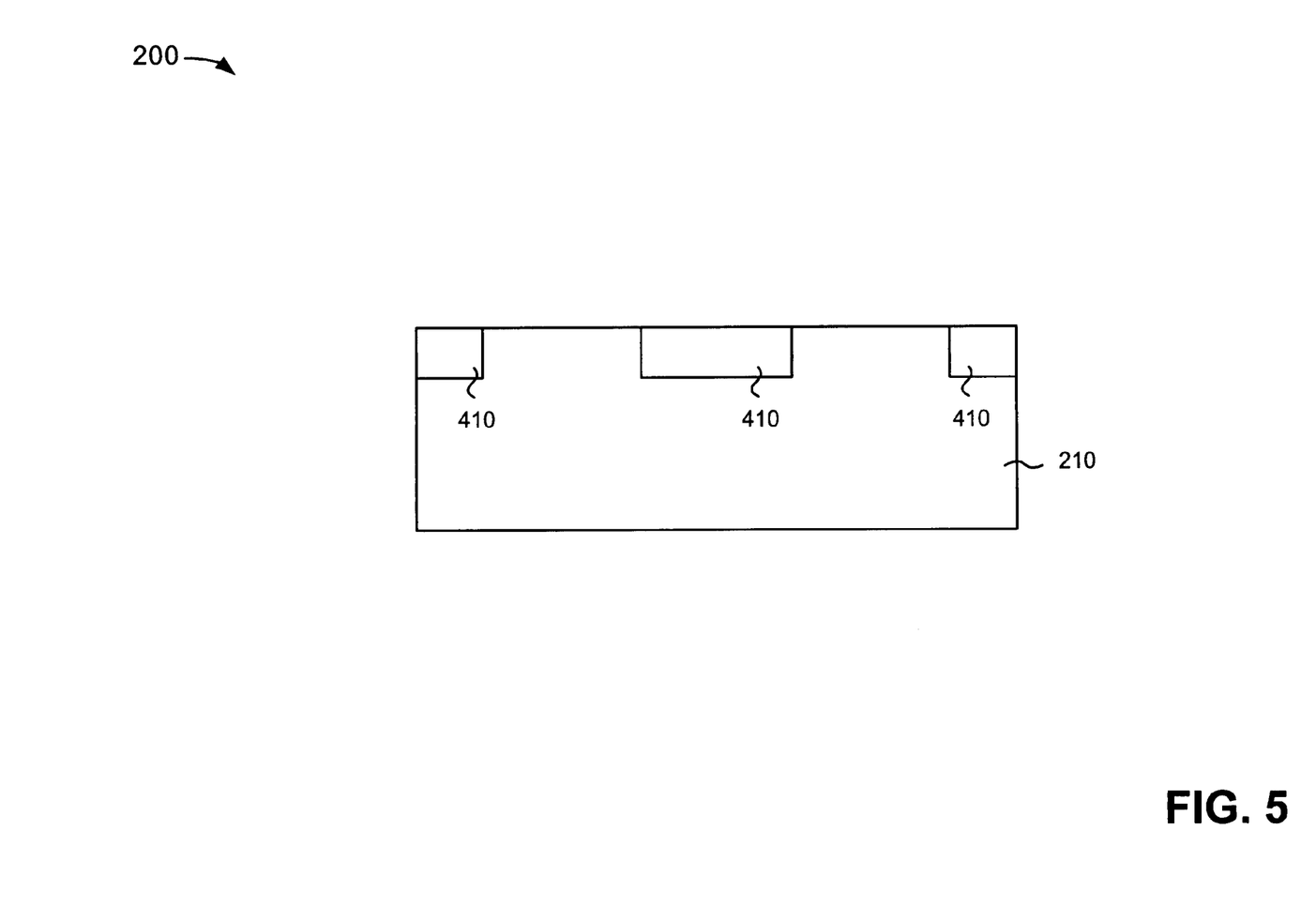

Hard mask structures 310 may be removed, as illustrated in FIG. 5 (act 120). Processing may then continue with the completion of memory cell fabrication (act 125). It will be appreciated that in other implementations consistent with the principles of the invention, one or more of the following acts may be performed prior to the formation of bit lines 410 described above.

Figure 6:
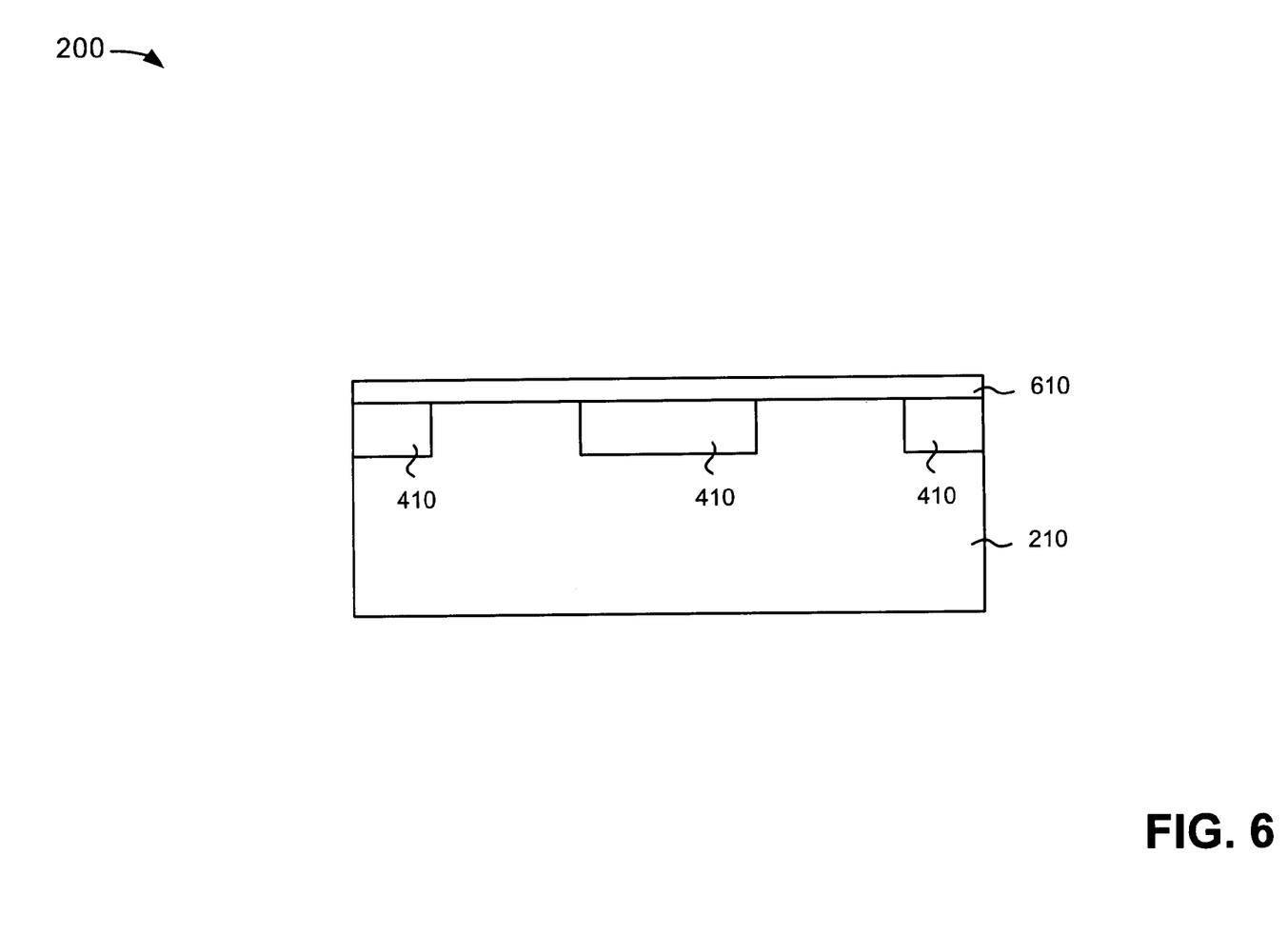

As discussed above, area 210 may represent a memory cell array. Each memory cell, for example, may be formed by forming a dielectric layer 610, such as a silicon oxide layer, on device 200, as illustrated in FIG. 6. In one implementation, dielectric layer 610 may comprise SiO$_2$ and may be deposited using chemical vapor deposition (CVD) (or thermally grown) to a thickness ranging from about 50 Å to about 200 Å. It will be appreciated that dielectric layer 610 may comprise other materials that may be deposited or grown.

Figure 7:
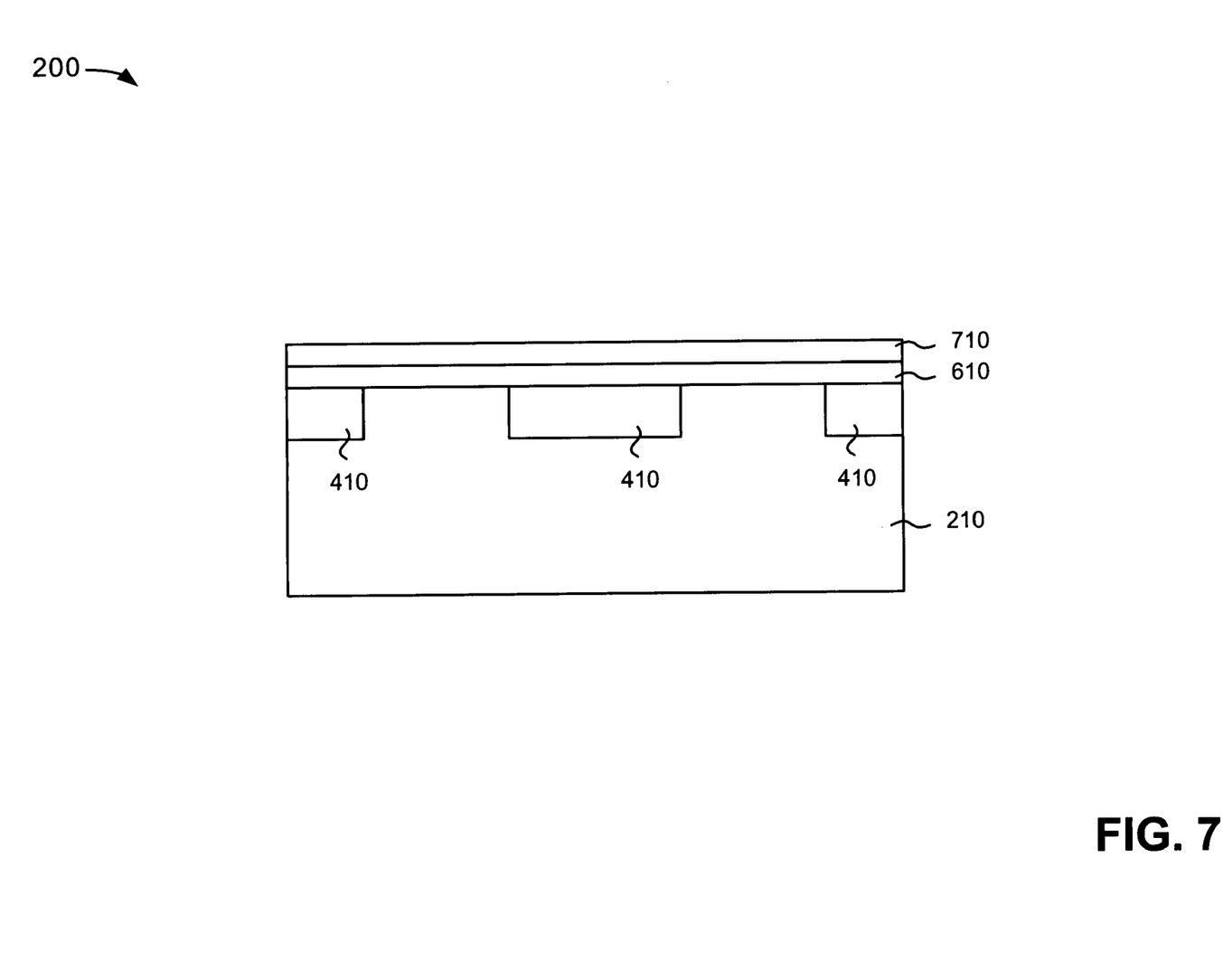

A charge storage layer 710 may be formed on dielectric layer 610, as illustrated in FIG. 7. In one implementation, charge storage layer 710 may be formed, for example, from a non-conductive material, such as a silicon nitride material, a silicon oxide material, or another dielectric material, and may be deposited to a thickness ranging from about 50 Å to about 500 Å.

Figure 8:
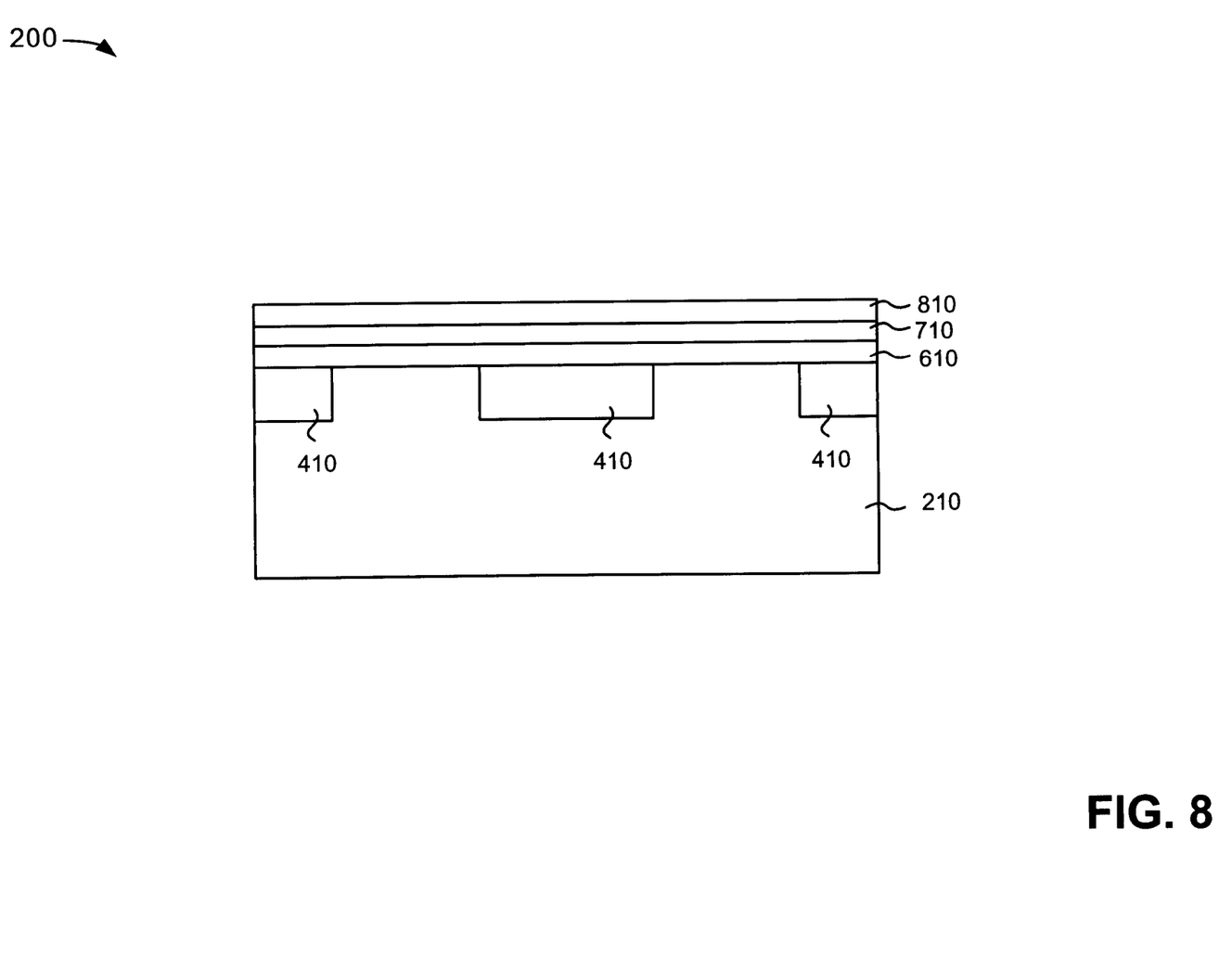

A dielectric layer 810 may be formed on charge storage layer 710, as illustrated in FIG. 8. In an exemplary implementation, dielectric layer 810 may comprise silicon dioxide or another material formed to a thickness ranging from about 30 Å to about 200 Å.

Figure 9:
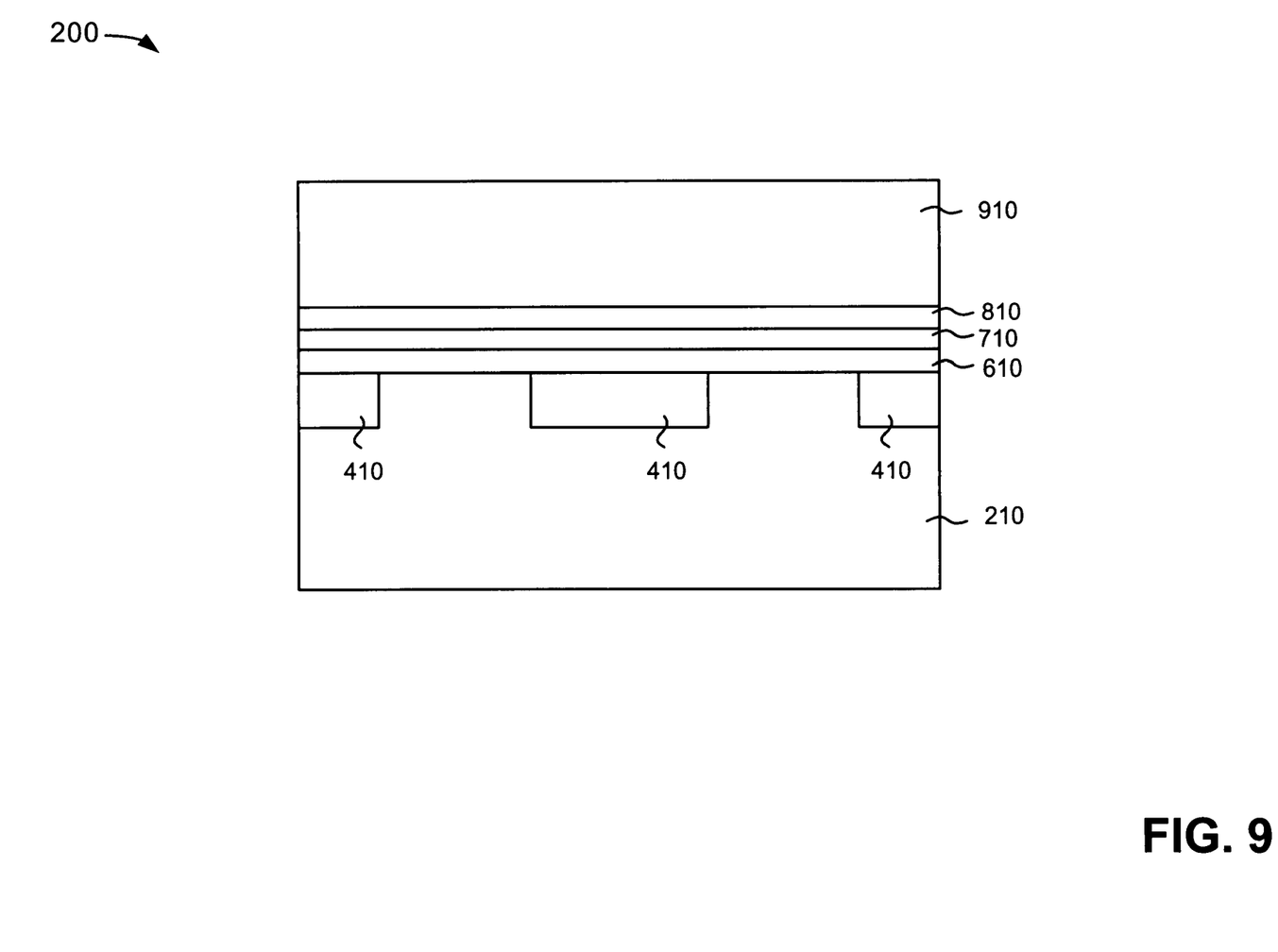

A polysilicon layer may be deposited, patterned, and etched to form word line 910 over dielectric layer 810, as illustrated in FIG. 9. As will be appreciated, word line 910 may function as a control gate electrode. In one implementation, the polysilicon layer may be deposited to a thickness ranging from about 500 Å to about 3,000 Å.

Semiconductor device 200 illustrated in FIG. 9 may be a silicon-oxide-nitride-oxide-silicon (SONOS) type memory device, with layer 710 acting as a charge storage element for each memory cell of the memory device. Each memory cell may be an EEPROM type memory device and one or more programming circuits (not shown) may be used to facilitate programming and erasing of one or more memory cells of semiconductor device 200.

Figure 10:
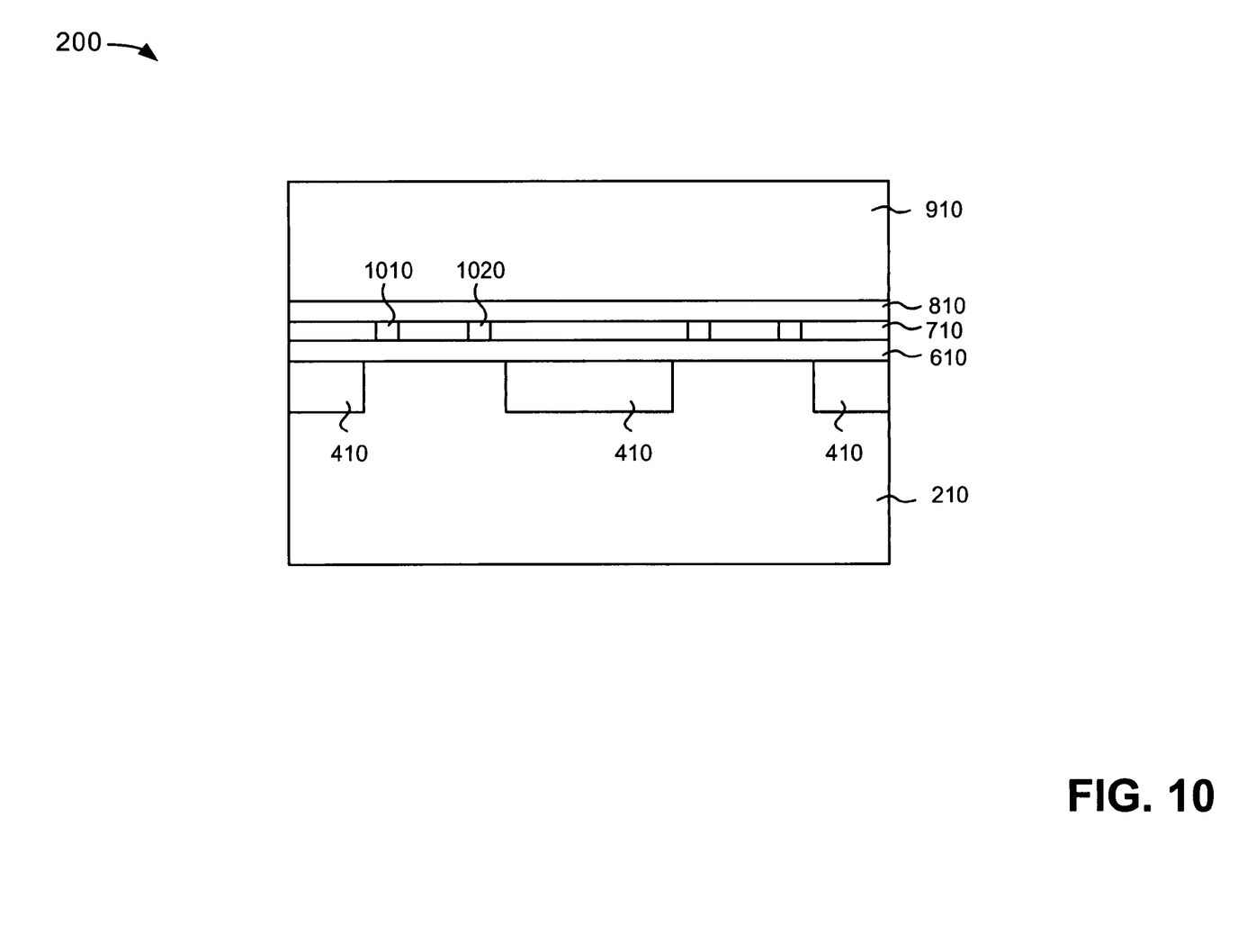

In one implementation consistent with the invention, each memory cell of semiconductor device 200 may be configured to store two bits of data (labeled 1010 and 1020), as illustrated in FIG. 10. That is, charge storage layer 710 may be programmed to store two separate bits of data 1010 and 1020 by localizing the first and second charges to the respective left and right sides of charge storage layer 710, as illustrated in FIG. 10. For example, each of the two bits 1010 and 1020 of a memory cell may be programmed independently by, for example, channel hot electron injection, to store a bit on each respective side of the charge storage layer 710. In this manner, the charges in charge storage layer 710 become effectively trapped on each respective side of charge storage layer 710. Erasing of each bit in the memory cell may also be performed independently. During erasing, the bits stored in charge storage layer 710 may tunnel through dielectric layer 610 into a bit line 410.

Fabrication processing may then continue with the formation of various interconnects based on the particular circuit requirements. For example, a dielectric layer (not shown) may be deposited over semiconductor device 200. The dielectric layer may act as an inter-layer dielectric (ILD) for semiconductor device 200. The ILD may include, for example, a phosphosilicate glass (PSG) material, a borophosphosilicate (BSPG) material, an oxide or some other dielectric material.

The ILD may optionally be planarized using a conventional process, such as a chemical-mechanical polishing (CMP) process. The CMP process may planarize the top surface of the ILD to facilitate formation of subsequent structures, such as interconnect lines. The ILD functions to isolate various conductive structures, such as various interconnect lines (not shown) or bit lines 410 from an external electrode, etc.

For example, a trench (not shown) may subsequently be formed in the ILD using conventional photolithographic and etching techniques. The trench may be used to form a contact to, for example, a bit line 410. Next, a metal layer, such as copper or aluminum, may be deposited to fill the trench.

An interconnect line may be formed over the planarized top surface of the ILD. For example, a metal, such as copper or aluminum, may be deposited to form an interconnect that connects various features in semiconductor device 200, such as bit lines 410 to an external electrode, to facilitate programming or erasing the various memory cells in semiconductor device 200.

Thus, in implementations consistent with the principles of the invention, disposable hard mask structures may be used in the fabrication of a semiconductor memory device to precisely control the junction profile, thereby improving the performance of the memory device.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, implementations consistent with the invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method comprising:
    forming a hard mask layer on a semiconductor device;
    forming a photoresist layer;
    patterning the photoresist layer;
    etching the hard mask layer using the patterned photoresist layer to form a plurality of hard mask structures, where each of the plurality of hard mask structures has a substantially rectangular cross-sectional shape, and where the plurality of hard mask structures is formed at a pitch ranging from about 900 Å to about 2,400 Å; and
    performing an ion implantation to form source or drain junctions between successive hard mask structures.

2. The method of claim 1 further comprising:
    removing the hard mask structures after performing the ion implantation.

3. The method of claim 1 where the forming the hard mask layer comprises:
    forming the hard mask layer to a thickness ranging from about 500 Å to about 5,000 Å.

4. The method of claim 1 where the hard mask layer comprises at least one of a carbon-based material or a material comprising a polymer.

5. The method of claim 1 further comprising:
    forming an additional layer between the hard mask layer and the photoresist layer.

6. The method of claim 5 where the additional layer comprises an anti-reflective coating.

7. The method of claim 5 where the additional layer comprises an additional hard mask layer.

8. The method of claim 5 where the forming an additional layer comprises:
    forming the additional layer to a thickness ranging from about 100 Å to about 3,000 Å.

9. The method of claim 1 where a width of each source or drain junction ranges from about 200 Å to about 600 Å and a depth ranging from about 200 Å to about 3,000 Å.

10. The method of claim 1 where a first side of at least one of the source or drain junctions is substantially aligned with a side wall of a first one of the plurality of hard mask structures and a second side of the at least one of the source or drain junctions is substantially aligned with a side wall of a second one of the plurality of hard mask structures.

11. A method comprising:
    forming a plurality of disposable hard mask structures on a semiconductor device comprising a plurality of memory cells, where the plurality of disposable hard mask structures is formed at a pitch ranging from about 900 Å to about 2,400 Å; and
    using the plurality of disposable hard mask structures to precisely control a junction profile of the plurality of memory cells.

12. The method of claim 11 where the disposable hard mask structures comprise a material having a low dielectric constant.

13. The method of claim 11 where each of the plurality of disposable hard mask structures comprises a top section and a bottom section, the top section comprising a first material and the bottom section comprising a second material.

14. The method of claim 13 where the first material comprises an anti-reflective coating and the second material comprises a material with a low dielectric constant.

15. The method of claim 11 further comprising:
    removing the plurality of hard mask structures after forming junctions for the plurality of memory cells.

16. The method of claim 11 where the forming a plurality of disposable hard mask structures comprises:
    forming each of the plurality of disposable hard mask structures to a width ranging from 450 Å to about 1,200 Å and a height ranging from about 500 Å to about 5,000 Å.

17. The method of claim 11 where the plurality of hard mask structures have a substantially rectangular cross-sectional shape.

18. A method for forming a bit line comprising:
    forming a plurality of hard mask structures using a photoresist, each hard mask structure being formed to a width ranging from 450 Å to about 1,200 Å and a height ranging from about 500 Å to about 5,000 Å, and where each of the plurality of hard mask structures has a substantially rectangular cross-sectional shape, and where the plurality of hard mask structures is formed at a pitch ranging from about 900 Å to about 2,400 Å;
    performing a first implant process to form the bit line after forming the plurality of hard mask structures; and
    removing the plurality of hard mask structures after performing the first implant process.

19. The method of claim 18 where the forming comprises:
    forming a hard mask layer on a semiconductor device,
    forming a photoresist layer,
    patterning the photoresist layer, and
    etching the hard mask layer using the patterned photoresist layer to form the plurality of hard mask structures.

* * * * *